(12) United States Patent
Narayanasamy et al.

(10) Patent No.: US 11,908,771 B2
(45) Date of Patent: Feb. 20, 2024

(54) POWER SEMICONDUCTOR DEVICE WITH DUAL HEAT DISSIPATION STRUCTURES

(71) Applicant: Infineon Technologies AG, Neubiberg (DE)

(72) Inventors: Jayaganasan Narayanasamy, Melaka - Durian Tunggal (MY); Angel Enverga, Melaka (MY); Chii Shang Hong, Melaka (MY); Chee Ming Lam, Melaka (MY); Sanjay Kumar Murugan, Melaka (MY); Subaramaniym Senivasan, Jasin (MY)

(73) Assignee: Infineon Technologies AG, Neubiberg (DE)

( * ) Notice: Subject to any disclaimer, the term of this patent is extended or adjusted under 35 U.S.C. 154(b) by 266 days.

(21) Appl. No.: 17/524,879

(22) Filed: Nov. 12, 2021

(65) Prior Publication Data

US 2023/0154827 A1    May 18, 2023

(51) Int. Cl.
*H01L 23/433*   (2006.01)
*H01L 23/495*   (2006.01)
(Continued)

(52) U.S. Cl.
CPC .... *H01L 23/4334* (2013.01); *H01L 23/49551* (2013.01); *H01L 23/49555* (2013.01); *H01L 23/49568* (2013.01); *H01L 23/49811* (2013.01); *H01L 24/84* (2013.01); *H01L 23/49513* (2013.01); *H01L 24/32* (2013.01);
(Continued)

(58) Field of Classification Search
CPC ........... H01L 23/49555; H01L 23/4334; H01L 23/49568; H01L 23/49551; H01L 23/49811; H01L 24/40; H01L 24/84; H01L 2224/40175
See application file for complete search history.

(56) References Cited

U.S. PATENT DOCUMENTS

| 3,786,317 A | 1/1974 | Thierfelder |
| 4,961,125 A | 10/1990 | Jordan et al. |

(Continued)

FOREIGN PATENT DOCUMENTS

| DE | 102020004379 A1 | 2/2021 |
| EP | 0926733 A1 | 6/1999 |

(Continued)

*Primary Examiner* — Alonzo Chambliss
(74) *Attorney, Agent, or Firm* — Murphy, Bilak & Homiller, PLLC

(57) ABSTRACT

A molded semiconductor package includes: a semiconductor die; a substrate attached to a first side of the semiconductor die; a plurality of leads electrically connected to a pad at a second side of the semiconductor die opposite the first side; a heat sink clip thermally coupled to the pad; and a molding compound encapsulating the semiconductor die, part of the leads, part of the heat sink clip, and at least part of the substrate. The molding compound has a first main side, a second main side opposite the first main side and at which the substrate is disposed, and an edge extending between the first main side and the second main side. The leads protrude from opposing first and second faces of the edge of the molding compound. The heat sink clip protrudes from opposing third and fourth faces of the edge of the molding compound.

23 Claims, 14 Drawing Sheets

(51) Int. Cl.
*H01L 23/367* (2006.01)
*H01L 23/498* (2006.01)
*H01L 23/00* (2006.01)

(52) U.S. Cl.
CPC .............. *H01L 24/40* (2013.01); *H01L 24/73* (2013.01); *H01L 2224/32245* (2013.01); *H01L 2224/40175* (2013.01); *H01L 2224/73263* (2013.01)

(56) References Cited

U.S. PATENT DOCUMENTS

| | | | |
|---|---|---|---|
| 5,047,837 A | 9/1991 | Kitano et al. | |
| 6,249,041 B1 * | 6/2001 | Kasem | H01L 24/33 257/E23.044 |
| 6,256,200 B1 * | 7/2001 | Lam | H01L 24/35 361/813 |
| 6,262,893 B1 | 7/2001 | Liu | |
| 11,600,547 B2 * | 3/2023 | Joanna Chye | H01L 23/49524 |
| 2002/0125562 A1 * | 9/2002 | Crowley | H01L 23/49562 257/E23.044 |
| 2008/0157401 A1 * | 7/2008 | Kim | H01L 23/49575 257/787 |
| 2015/0221584 A1 * | 8/2015 | Lopez | H01L 23/49562 257/676 |
| 2019/0157190 A1 | 5/2019 | Fuergut et al. | |

FOREIGN PATENT DOCUMENTS

| | | |
|---|---|---|
| EP | 1113495 A2 | 7/2001 |
| GB | 1361566 A | 7/1974 |

* cited by examiner

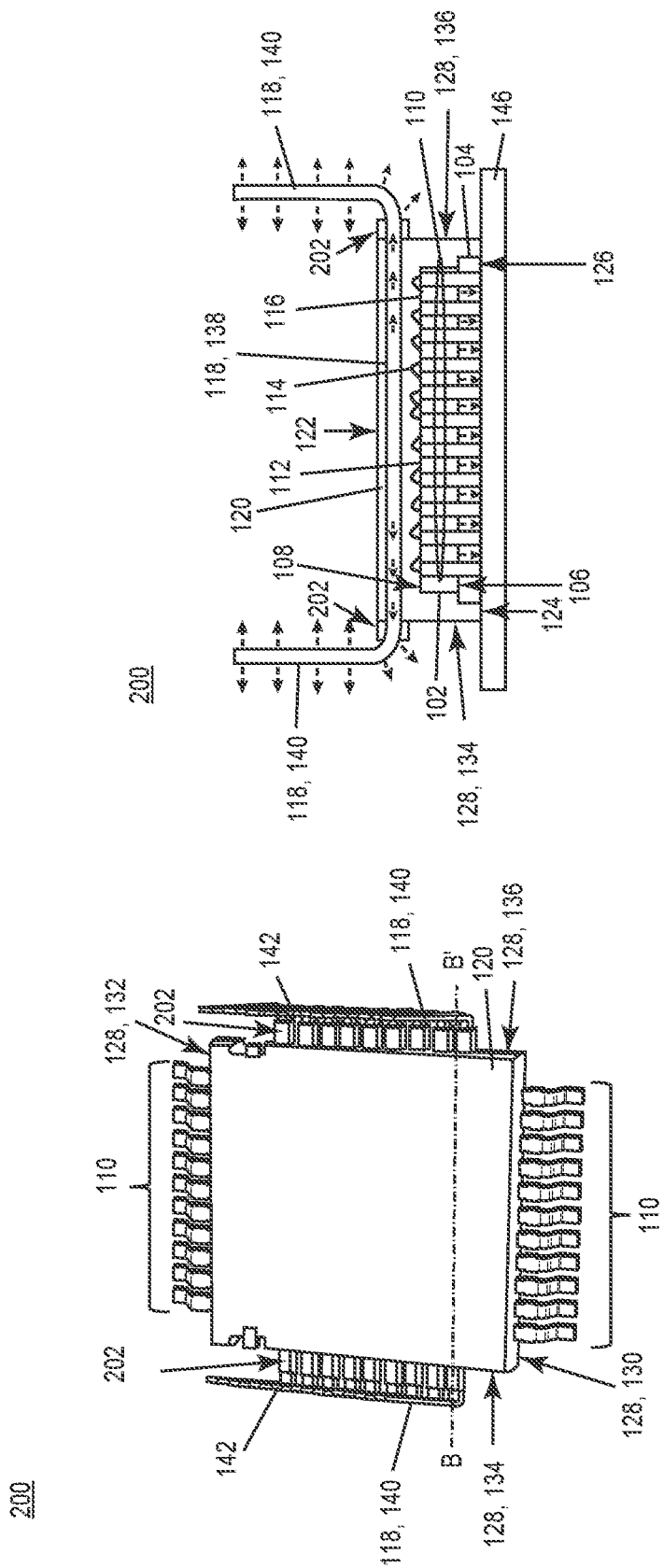

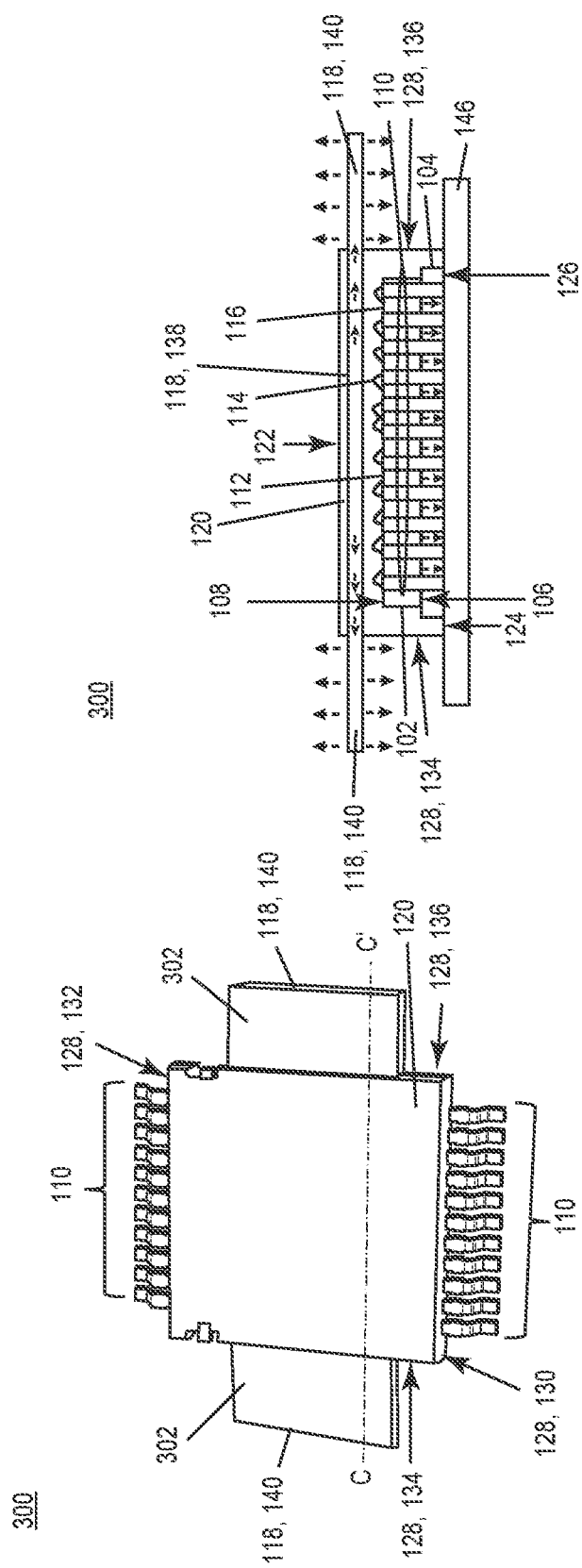

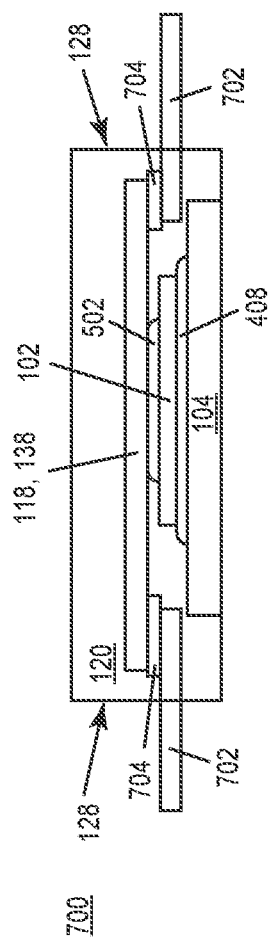
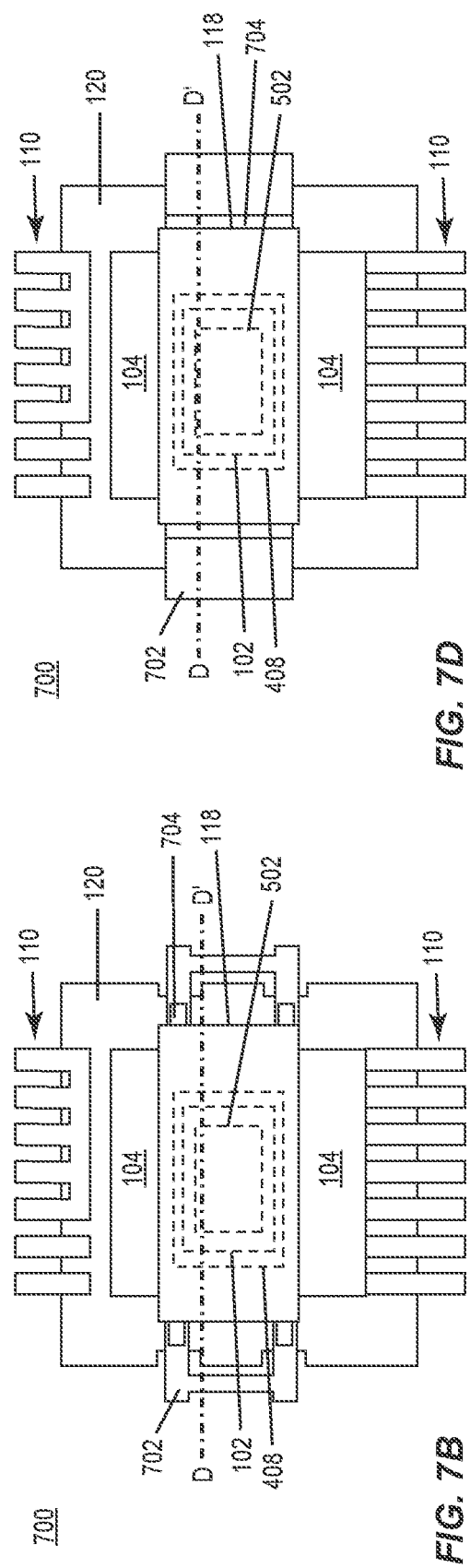
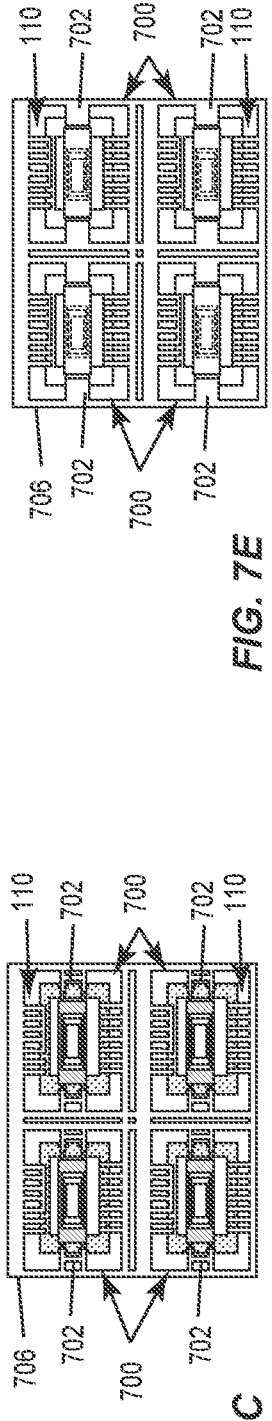
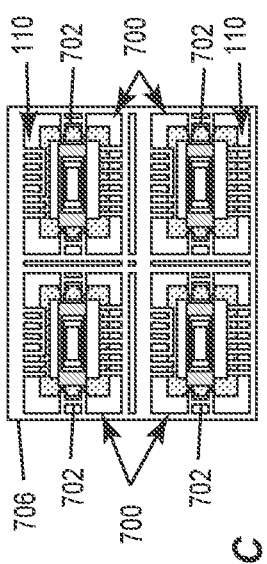
FIG. 7A
FIG. 7B
FIG. 7C
FIG. 7D
FIG. 7E

POWER SEMICONDUCTOR DEVICE WITH DUAL HEAT DISSIPATION STRUCTURES

BACKGROUND

Double sided cooling for power semiconductor packages provide 50% lower thermal resistance compared to top side only cooling packages. A grinding method is typically used to expose a copper block at the package top side. However, some tilt of the copper block can be expected as part of normal manufacturing tolerances. Tilted copper blocks leads to inconsistent exposed cooling surfaces where some copper blocks have more exposure than others. Also, the conventional process increases the overall cost of the package due to added steps of grinding, taping, etc. When attached to a circuit board, warpage of the board occurs which requires thicker thermal interface material. A thicker thermal interface material reduces the overall thermal performance of the system.

Thus, there is a need for an improved power semiconductor package and corresponding method of manufacturing.

SUMMARY

According to an embodiment of a molded semiconductor package, the molded semiconductor package comprises: a semiconductor die; a substrate attached to a first side of the semiconductor die; a plurality of leads electrically connected to a pad at a second side of the semiconductor die opposite the first side; a heat sink clip thermally coupled to the pad; and a molding compound encapsulating the semiconductor die, part of the leads, part of the heat sink clip, and at least part of the substrate, wherein the molding compound has a first main side, a second main side opposite the first main side and at which the substrate is disposed, and an edge extending between the first main side and the second main side, wherein the leads protrude from opposing first and second faces of the edge of the molding compound, wherein the heat sink clip protrudes from opposing third and fourth faces of the edge of the molding compound.

According to an embodiment of an electronic assembly, the electronic assembly comprises: a circuit board; and a molded semiconductor package attached to the circuit board, wherein the molded semiconductor package comprises: a semiconductor die; a substrate attached to a first side of the semiconductor die; a plurality of leads electrically connected to a pad at a second side of the semiconductor die opposite the first side; a heat sink clip thermally coupled to the pad; and a molding compound encapsulating the semiconductor die, part of the leads, part of the heat sink clip, and at least part of the substrate, wherein the molding compound has a first main side, a second main side opposite the first main side and at which the substrate is disposed, and an edge extending between the first main side and the second main side, wherein the leads protrude from opposing first and second faces of the edge of the molding compound and attach to the circuit board, wherein the heat sink clip protrudes from opposing third and fourth faces of the edge of the molding compound.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2A illustrates a top perspective view of another embodiment of a dual functional thermal performance semiconductor package, and FIG. 2B illustrates a cross-sectional taken along the line labelled B-B' in FIG. 2A.

FIG. 3A illustrates a top perspective view of another embodiment of a dual functional thermal performance semiconductor package, and FIG. 3B illustrates a cross-sectional taken along the line labelled C-C' in FIG. 3A.

FIGS. 7A through 7E illustrate different views of another embodiment of a dual functional thermal performance semiconductor package.

DETAILED DESCRIPTION

The embodiments described herein provide a dual functional thermal performance semiconductor package and related methods of manufacturing. The semiconductor package provides for double side cooling, but not by having to grind (thin) the package topside. Instead, the leads of the package protrude from opposing first and second faces of the edge of the molding compound that forms the main body of the package. A heat sink clip thermally coupled to a semiconductor die embedded in the molding compound protrudes from opposing third and fourth faces of the edge of the molding compound. Such semiconductor packages are manufactured without having to thin the topside of the molding compound to expose part of the heat sink clip and without producing inconsistent exposed cooling surfaces that result from tilted copper blocks.

Described next, with reference to the figures, are exemplary embodiments of the dual functional thermal performance semiconductor package, methods of producing the dual functional thermal performance semiconductor package, and electronic assemblies that incorporate the dual functional thermal performance semiconductor package.

Figures 1A, 1B:
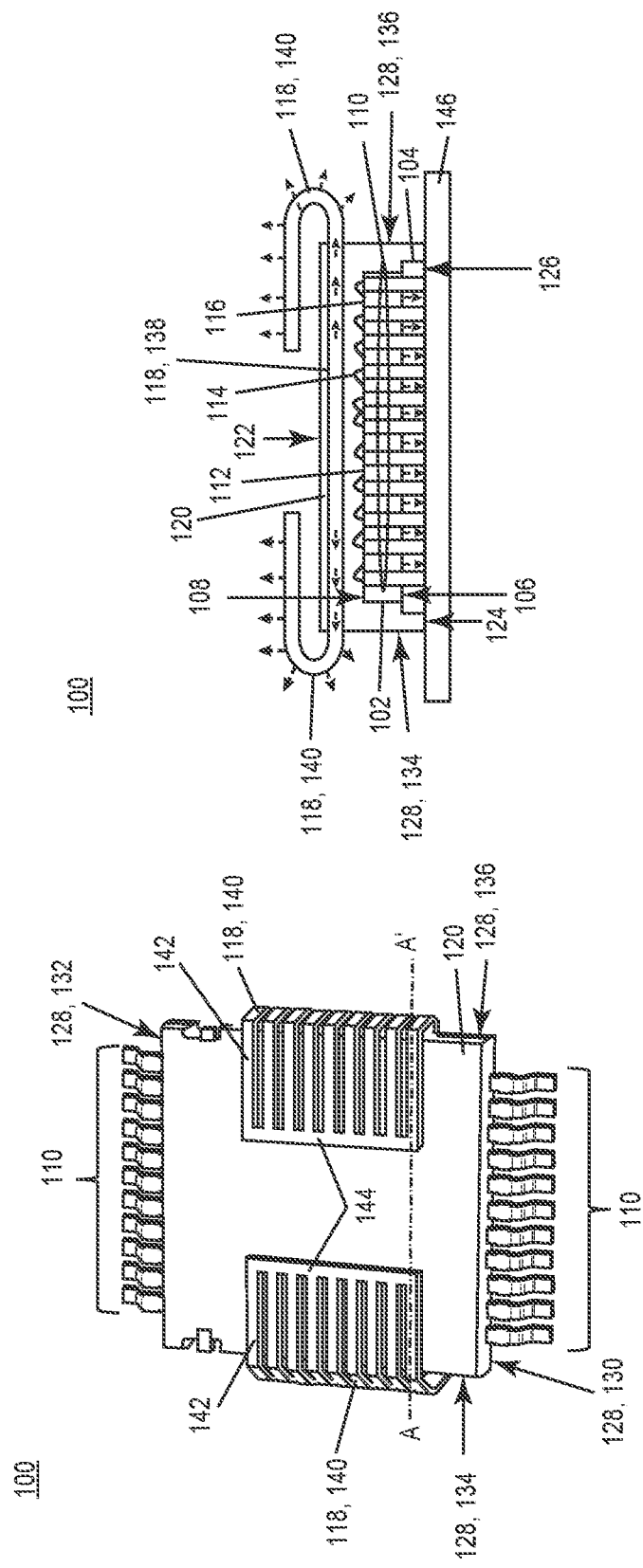
FIG. 1A illustrates a top perspective view of an embodiment of a dual functional thermal performance semiconductor package.
FIG. 1B illustrates a cross-sectional taken along the line labelled A-A' in FIG. 1A.

FIGS. 1A and 1B illustrate an embodiment of a dual functional thermal performance semiconductor package 100. FIG. 1A shows a top perspective view of the package 100, and FIG. 1B shows a cross-sectional taken along the line labelled A-A' in FIG. 1A.

The dual functional thermal performance semiconductor package 100 includes a semiconductor die 102 and a substrate 104 such as a die paddle of a leadframe attached to a first side 106 of the semiconductor die 102. Other types of substrates 104 may be used.

The semiconductor die 102 may be a logic die such as a processor die, memory die, etc., a power semiconductor die such as a power transistor die, a power diode die, a half bridge die, etc., or a die that combines logic and power devices on the same semiconductor substrate. In one embodiment, the semiconductor die 102 is a vertical semiconductor die having a primary current path between the opposing main sides 106, 108 of the die 102. Examples of vertical power semiconductor dies include but are not limited to power Si MOSFETs (metal-oxide-semiconductor field-effect transistors), IGBTs (insulated-gate bipolar transistors), SiC MOSFETs, GaN HEMTs (high-electron mobility transistors), etc. In one embodiment, the dual functional thermal performance semiconductor package 100 is a power semiconductor package and the semiconductor die 102 is a power semiconductor die such as a Si MOSFET, IGBT, SiC MOSFET, GaN HEMT, etc. More than one semiconductor die 102 may be included in the package 100.

The dual functional thermal performance semiconductor package 100 also includes leads 110 electrically connected to a pad 112 from which heat emanates at the second side 108 of the semiconductor die 102 during operation of the die 102. For example, the pad 112 may be a source pad or an emitter pad in the case of a power semiconductor die 102. The leads 110 are electrically connected to the pad 112 by electrical conductors 114 such as bond wires, ribbons, etc. One or more of the leads 110 may be electrically connected to a separate pad 116 such as a gate pad, sense pad, etc. at the second side 108 of the semiconductor die 102. The leads 110 may be produced from a leadframe, for example. The leads 110 may be produced from a leadframe.

The dual functional thermal performance semiconductor package 100 further includes a heat sink clip 118 thermally coupled to the pad 112 from which heat emanates at the second side 108 of the semiconductor die 102 during operation of the die 102. The heat sink clip 118 may comprise copper, for example.

A molding compound 120 encapsulates the semiconductor die 102, part of the leads 110, part of the heat sink clip 118, and at least part of the substrate 104. The molding compound 120 has a first main side 122 and a second main side 124 opposite the first main side 122. The substrate 104 is disposed at the second main side 124 of the molding compound 120. In one embodiment, the side 126 of the substrate 104 facing away from the heat sink clip 118 is uncovered by the molding compound 120 at the second main side 124 of the molding compound 120. According to this embodiment, the semiconductor die 102 has double-sided cooling via the substrate 104 at the first side 106 of the semiconductor die 102 and via the heat sink clip 118 at the second side 108 of the semiconductor die 102.

The edge 128 of the molding compound 120 extends between the first main side 122 and the second main side 124 of the molding compound 120 to define a side perimeter or boundary of the molded part of the dual functional thermal performance semiconductor package 100. The leads 110 protrude from opposing first and second faces 130, 132 of the edge 128 of the molding compound 120. The heat sink clip 118 protrudes from opposing third and fourth faces 134, 136 of the edge 128 of the molding compound 120.

Unlike conventional molded semiconductor packages that require topside thinning to expose a copper block for double sided cooling, the dual functional thermal performance semiconductor package 100 provides double sided cooling by the heat sink clip 118 protruding from opposing faces 134, 136 of the edge 128 of the molding compound 120 and by at least part of the substrate 104 being uncovered by the molding compound 120. The heat dissipation paths are indicated by dashed arrows in FIG. 1B.

According to the embodiment illustrated in FIGS. 1A and 1B, a first part 138 of the heat sink clip 118 is disposed between the second side 108 of the semiconductor die 102 and the first main side 122 of the molding compound 120 and the first part 138 of the heat sink clip 118 is completely covered by the molding compound 120 at the first main side 122 of the molding compound 120. A second part 140 of the heat sink clip 118 protrudes from the opposing third and fourth faces 134, 136 of the edge 128 of the molding compound 120. The second part 140 of the heat sink clip 118 may include a plurality of fins 142 which may or may not be connected by a connecting element 144 at the distal end of the second part 140. The second part 140 of the heat sink clip 118 may be bent over and cover part of the first main side 122 of the molding compound 120. Also as shown in FIG. 1B, the dual functional thermal performance semiconductor package 100 may be attached to a circuit board 146 such as a PCB (printed circuit board) which dissipates heat from the substrate 102. Heat emanating from the heat sink clip 118 may be dissipated by the air or by a cooling system such as a liquid cooling device, e.g., a radiator.

FIGS. 2A and 2B illustrate another embodiment of a dual functional thermal performance semiconductor package 200. FIG. 2A shows a top perspective view of the package 200, and FIG. 2B shows a cross-sectional taken along the line labelled B-B' in FIG. 2A. The embodiment illustrated in FIGS. 2A and 2B is similar to the embodiment illustrated in FIGS. 1A and 1B. Different, however, the part 138 of the heat sink clip 118 that protrudes from the opposing third and fourth faces 134, 136 of the edge 128 of the molding compound 120 is bent in a direction which the first main side 122 of the molding compound 120 faces without being bent over any part of the first main side 122 of the molding compound 120. In one embodiment, the molding compound 120 covers the heat sink clip 118 in a first region 202 where the second part 140 of the heat sink clip initially protrudes from the opposing third and fourth faces of the edge of the molding compound. The remainder of the second part 140 of the heat sink clip 118 spaced further outward than the first region 202 is uncovered by the molding compound 120.

FIGS. 3A and 3B illustrate another embodiment of a dual functional thermal performance semiconductor package 300. FIG. 3A shows a top perspective view of the package 300, and FIG. 3B shows a cross-sectional taken along the line labelled C-C' in FIG. 3A. The embodiment illustrated in FIGS. 3A and 3B is similar to the embodiment illustrated in FIGS. 1A and 1B. Different, however, the part 138 of the heat sink clip 118 that protrudes from the opposing third and fourth faces 134, 136 of the edge 128 of the molding compound 120 is unbent. Instead of fins 142, the second part 140 of the heat sink clip 118 that protrudes from the opposing third and fourth faces 134, 136 of the edge 128 of the molding compound 120 may instead be solid blocks 302, shown in FIG. 3A. The second part 140 of the heat sink clip 118 of the packages 100, 200 shown in FIGS. 1A-1B and 2A-2B also may be in the form of solid blocks 302 instead of fins 142.

Figure 4A:
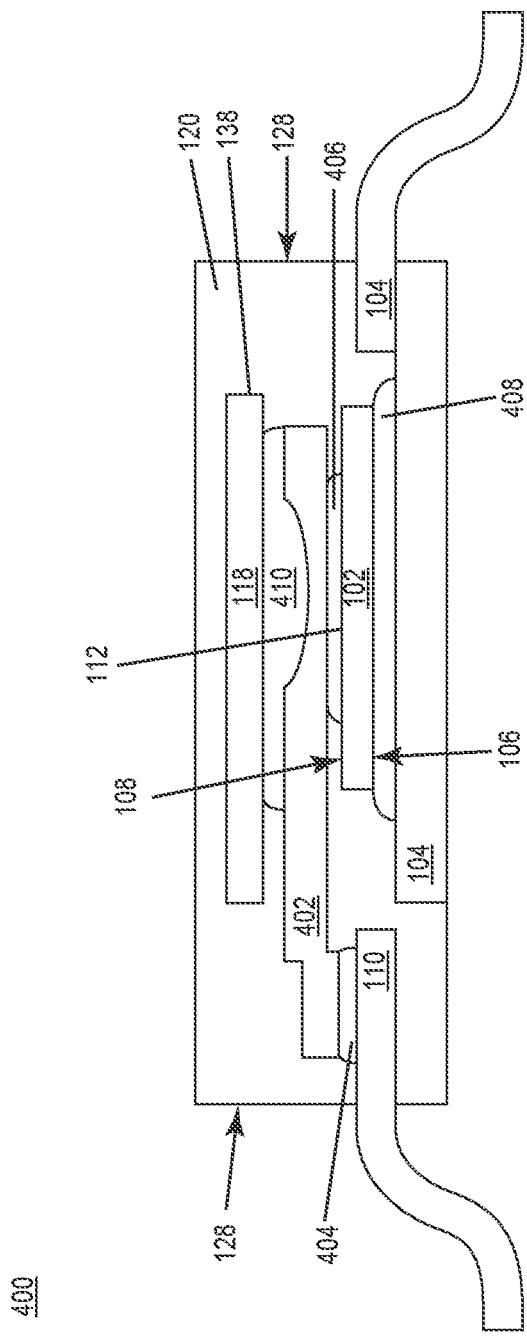
FIGS. 4A and 4B illustrate another embodiment of a dual functional thermal performance semiconductor package, with FIG. 4A showing a different (rotated) cross-sectional view than FIG. 4B.
Figure 4B:
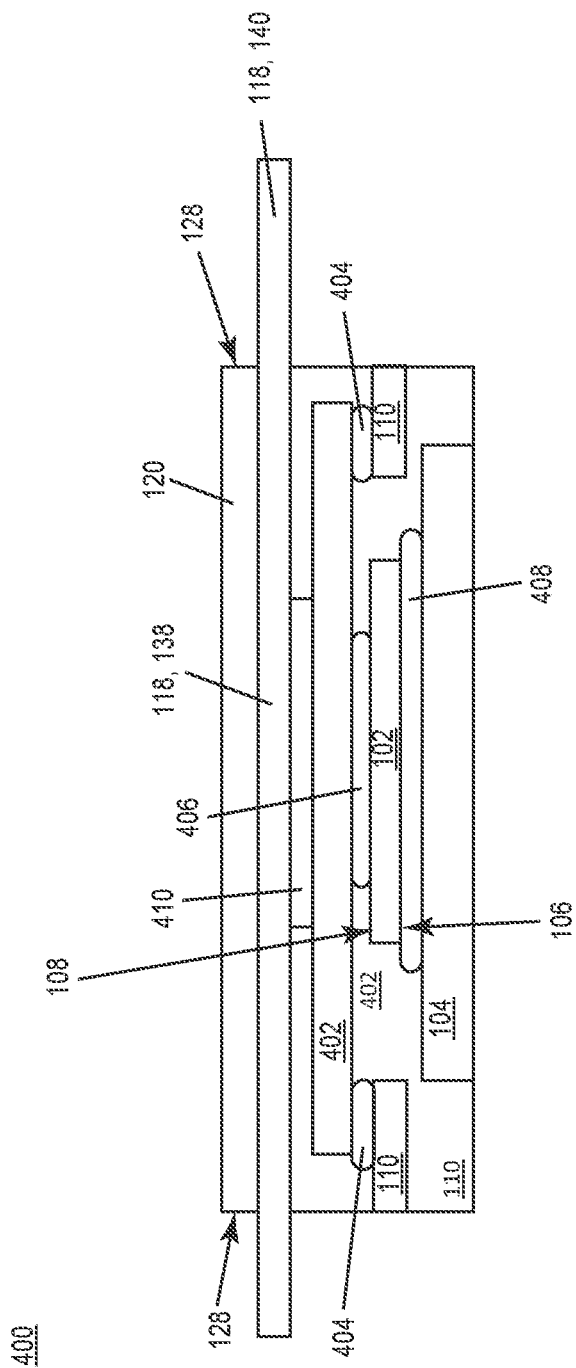

FIGS. 4A and 4B illustrate another embodiment of a dual functional thermal performance semiconductor package 400. FIG. 4A shows a different (90° rotated) cross-sectional view than FIG. 4B such that in FIG. 4A, the leads 110 are visibly protruding from the edge 128 of the molding compound 120 whereas in FIG. 4B, the second part 140 of the heat sink clip 118 is visibly protruding from the edge 128 of the molding compound 120. According to this embodiment, the package leads 100 are soldered to an additional metal clip 402 inside the molding compound 120 via a soldered joint 404. The additional metal clip 402 is attached to the die pad 112 from which heat emanates at the second side 108 of the semiconductor die 102 during operation of the die 102, e.g., via a soldered joint 406, and the first side 106 of the semiconductor die 102 may be attached to the substrate 104 via a another soldered joint 408. The first part 138 of the heat sink clip 118 is disposed between the additional metal clip 402 and the molding compound 120. An electrically insulative thermal interface material 410 embedded in the molding compound 120 thermally couples the additional metal clip 402 to the first part 138 of the heat sink clip 118 and electrically isolates the first part 138 of the heat sink clip 118 from the additional metal clip 402 to ensure proper electrical isolation. Any electrically insulative thermal interface material 410 may be used, such as molding compound, ceramic, epoxy, etc. The first part 138 of the heat sink clip 118 may be completely covered by the molding compound 120 at the first main side 122 of the molding compound 120, as shown in FIGS. 4A and 4B.

Figure 5:
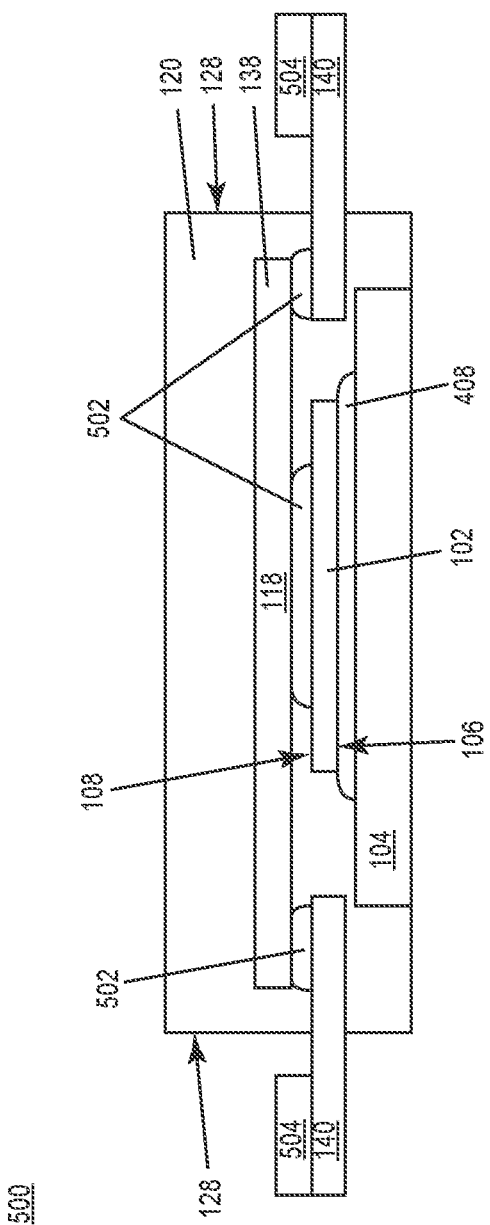
FIG. 5 illustrates a cross-sectional view of another embodiment of a dual functional thermal performance semiconductor package.

FIG. 5 illustrates another embodiment of a dual functional thermal performance semiconductor package 500. According to this embodiment, the second part 140 of the heat sink clip 118 is attached to the first part 138 of the heat sink clip 118 inside the molding compound 120 by solder 502. An electrically insulative thermal interface material 504 is applied to the second part 140 of the heat sink clip 118 outside the molding compound 120 to ensure proper electrical isolation. Any electrically insulative thermal interface material 504 may be used, such as molding compound, ceramic, epoxy, etc.

Figure 6:
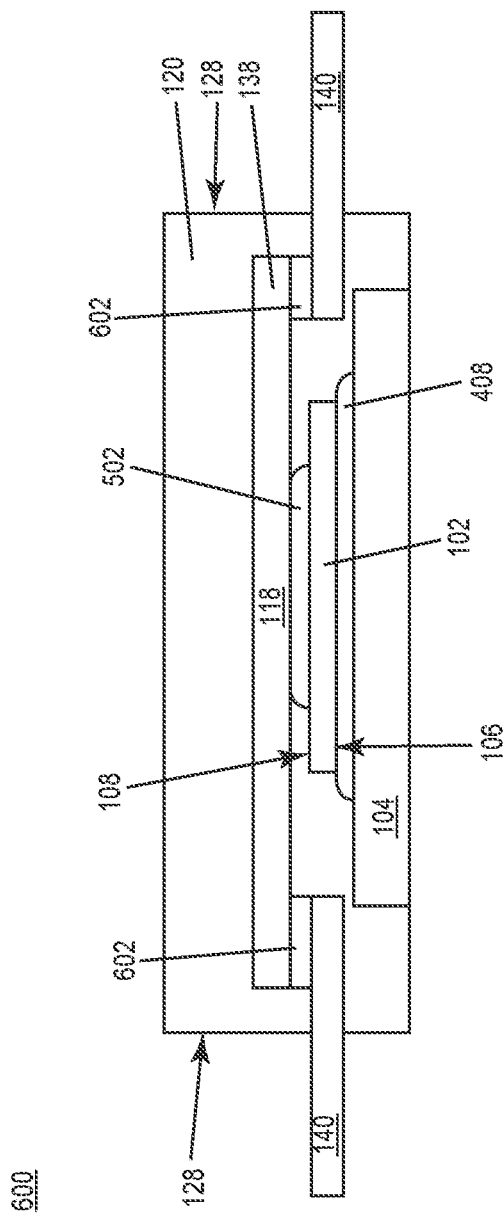
FIG. 6 illustrates a cross-sectional view of another embodiment of a dual functional thermal performance semiconductor package.

FIG. 6 illustrates another embodiment of a dual functional thermal performance semiconductor package 600. The embodiment illustrated in FIG. 6 is similar to the embodiment illustrated in FIG. 5. Different, however, the second part 140 of the heat sink clip 118 is thermally coupled to the first part 138 of the heat sink clip 118 inside the molding compound 120 by an electrically insulative thermal interface material 602 embedded in the molding compound 120. The electrically insulative thermal interface material 602 electrically isolates the first part 138 of the heat sink clip 118 from the second part 140 of the heat sink clip 118 inside the molded body of the package 600. Any electrically insulative thermal interface material 602 may be used, such as molding compound, ceramic, epoxy, etc.

FIGS. 7A through 7E illustrate another embodiment of a dual functional thermal performance semiconductor package 700. FIG. 7A shows a cross-sectional view of the package 400 along the line labelled D-D' in FIGS. 7B and 7D. FIG. 7B shows a top plan view of an embodiment of the package 700 after singulation and FIG. 7C shows a corresponding top plan view of multiples ones of the package 700 in FIG. 7B before singulation. FIG. 7D shows a top plan view of another embodiment of the package 700 after singulation and FIG. 7E shows a corresponding top plan view of multiple ones of the package 700 in FIG. 7D before singulation.

According to the embodiment illustrated in 7A through 7E, the heat sink clip 118 is electrically isolated from a tie bar 702 within the molding compound 120 by an electrically insulative thermal interface material 704. Any electrically insulative thermal interface material 704 may be used, such as molding compound, ceramic, epoxy, etc.

The tie bar 702 is part of a leadframe 706 that also includes the leads 110 and the substrate 104. The leadframe 706 may stamped, punched, etched, etc. to form the leads 110 and substrate 104. The tie bar 702 secures the substrate 104 to the periphery of the leadframe 706 to aid the manufacturing process. As shown in FIGS. 7C and 7E, several packages 700 may be concurrently produced using the same leadframe 706. Each package 700 is singulated by severing the lead and tie bar connections to the periphery of the leadframe 706. The tie bar 702 may be completely solid/continuous as shown in FIG. 7D or patterned as shown in FIG. 7B.

Figure 8:
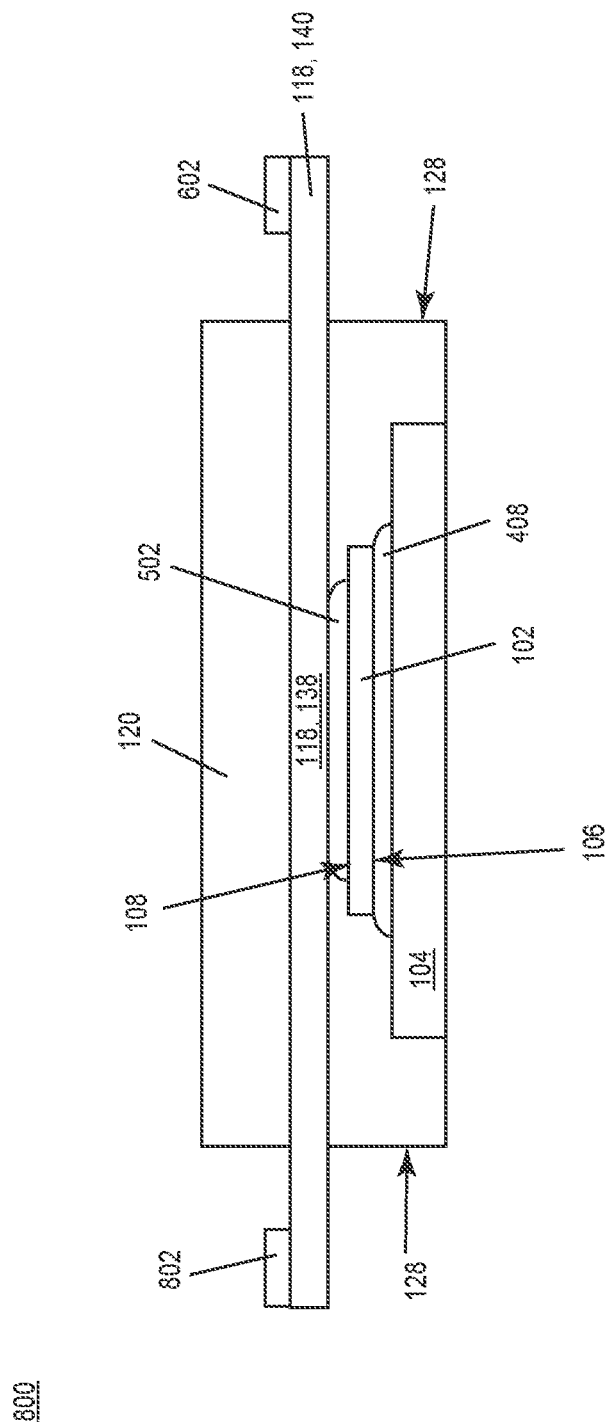
FIG. 8 illustrates a cross-sectional view of another embodiment of a dual functional thermal performance semiconductor package.

FIG. 8 illustrates another embodiment of a dual functional thermal performance semiconductor package 800. The embodiment illustrated in FIG. 8 is similar to the embodiment illustrated in FIG. 6. Different, however, an electrically insulative thermal interface material 802 is applied to the second part 140 of the heat sink clip 118 outside the molding compound 120. Any electrically insulative thermal interface material 802 may be used, such as molding compound, ceramic, epoxy, etc.

Figure 9:
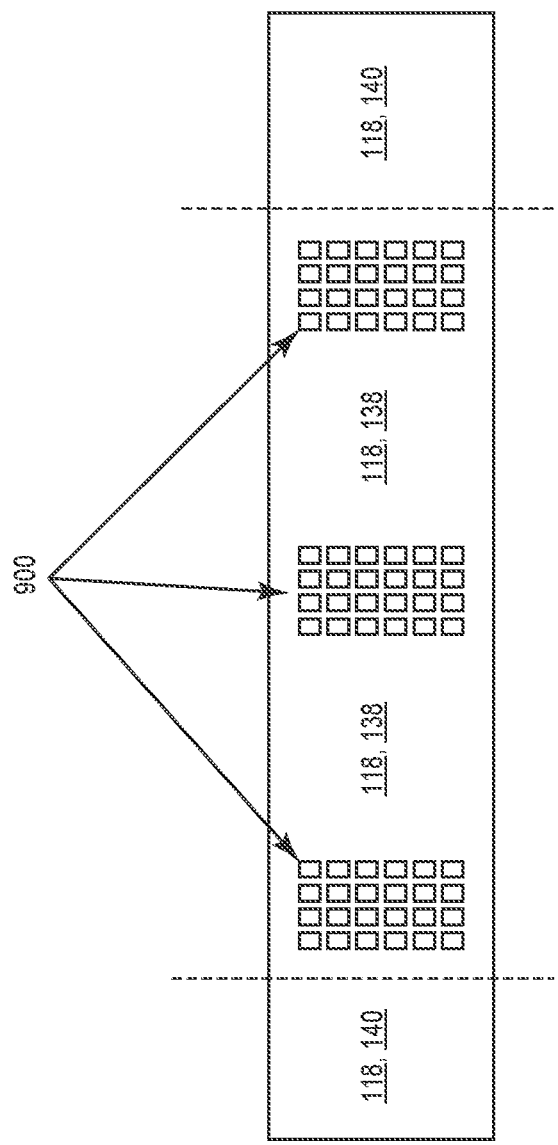
FIG. 9 illustrates a plan view of an embodiment of a heat sink clip included in the dual functional thermal performance semiconductor package described herein.

FIG. 9 illustrates a plan view of an embodiment of the heat sink clip 118. According to this embodiment, the first part 138 of the heat sink clip 118 that is disposed inside the molding compound 120 has openings 900. The molding compound 120 fills the openings 900 to increase the adhesion between the molding compound 120 and the heat sink clip 118. The molding compound 120 is not shown in FIG. 9 to emphasize the openings 800 in the heat sink clip 118. The vertical dashed lines in FIG. 9 indicate where the second part 140 of the heat sink clip 118 protrudes from the opposing third and fourth faces 134, 136 of the edge 128 of the molding compound 120.

Figure 10B:
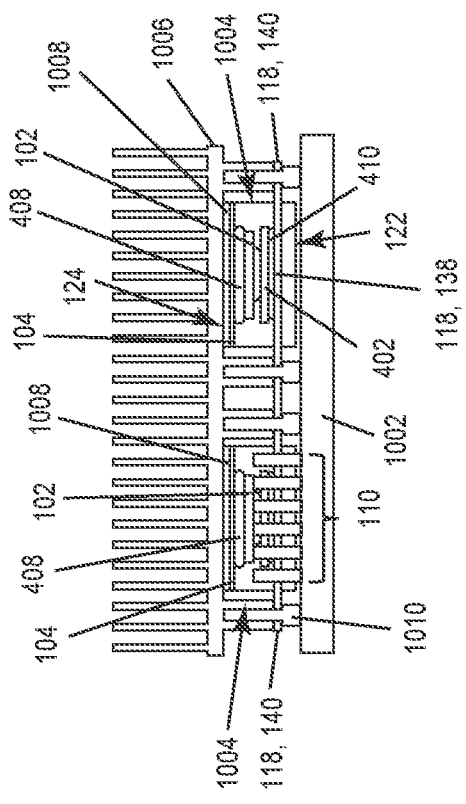
FIGS. 10A through 10D illustrate different views of an embodiment of an electronic assembly that includes a circuit board and one or more molded semiconductor packages attached to the circuit board.
Figure 10D:
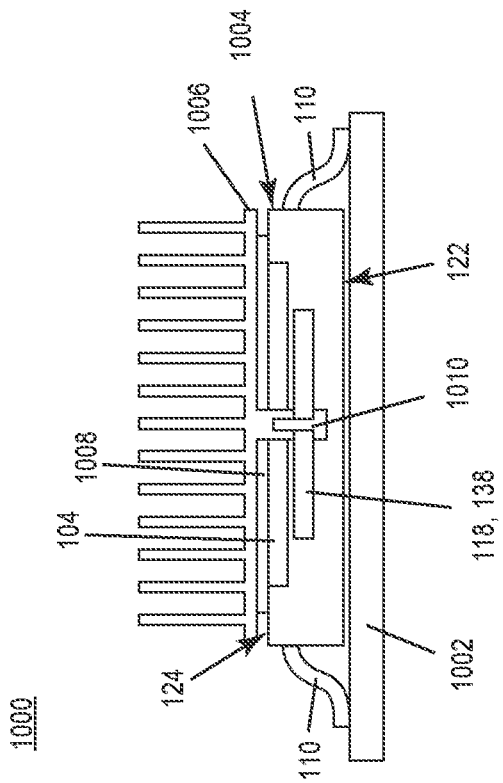
Figure 10A:
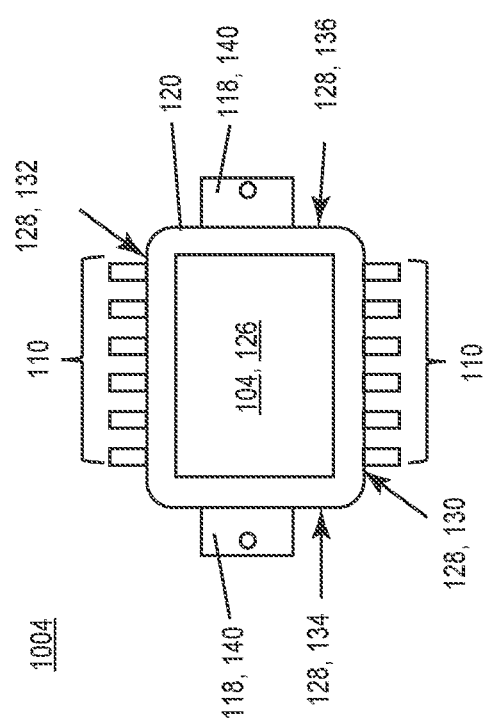
Figure 10C:
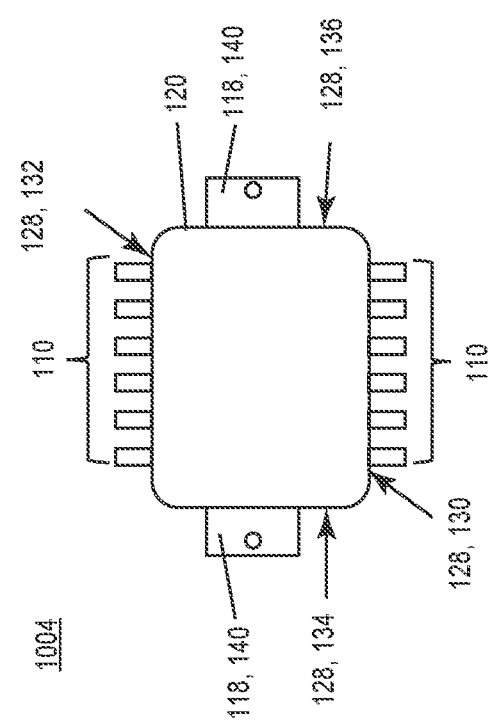

FIGS. 10A through 10D illustrate an embodiment of an electronic assembly 1000 that includes a circuit board 1002 and one or more molded semiconductor packages 1004 attached to the circuit board 1002. FIG. 10A shows a bottom plan view of an individual one of the molded semiconductor packages 1004. FIG. 100 shows a top plan view of an individual one of the molded semiconductor packages 1004. FIG. 10B shows a cross-sectional view of the electronic assembly 1000. FIG. 10D shows a different (90° rotated) cross-sectional view than FIG. 10B.

The circuit board 1002 of the electronic assembly 1000 may be a PCB, for example. Each molded semiconductor package 1004 corresponds to one of the packages previously described herein in connection with FIGS. 1A through 8. Accordingly, each molded semiconductor package includes at least one semiconductor die 102, a substrate 104 attached to a first side 106 of the semiconductor die 102, leads electrically 110 connected to a pad 112 at a second side 108 of the semiconductor die 102 opposite the first side 106, a heat sink clip 118 thermally coupled to the pad 112, and a molding compound 120 encapsulating the semiconductor die 102, part of the leads 110, part of the heat sink clip 118, and at least part of the substrate 104.

The electronic assembly 1000 may further include a heat sink thermally 1006 coupled to the substrate 104 of each molded semiconductor package 1004, e.g., via a thermal interface material 1008. Part of the leads 110 that protrude from the opposing first and second faces 130, 132 of the edge 118 of the molding compound 120 of each package 1004 attaches to the circuit board 1002 adjacent the first main side 122 of the molding compound 120. The second part 140 of the heat sink clip 118 that protrudes from the opposing third and fourth faces 134, 136 of the edge 128 of the molding compound 120 of each package 1004 is thermally coupled to the heat sink 1006 adjacent the second main side 124 of the molding compound 120. The heat sink clip 118 of each package 1004 and the heat sink 1006 are electrically insulated from one another, e.g., by aby of the thermal interface material embodiments previously described herein in connection with FIGS. 4A through 8. The heat sink 1006 is attached to the circuit board 1002 by one or more fasteners 1010.

Figure 11:
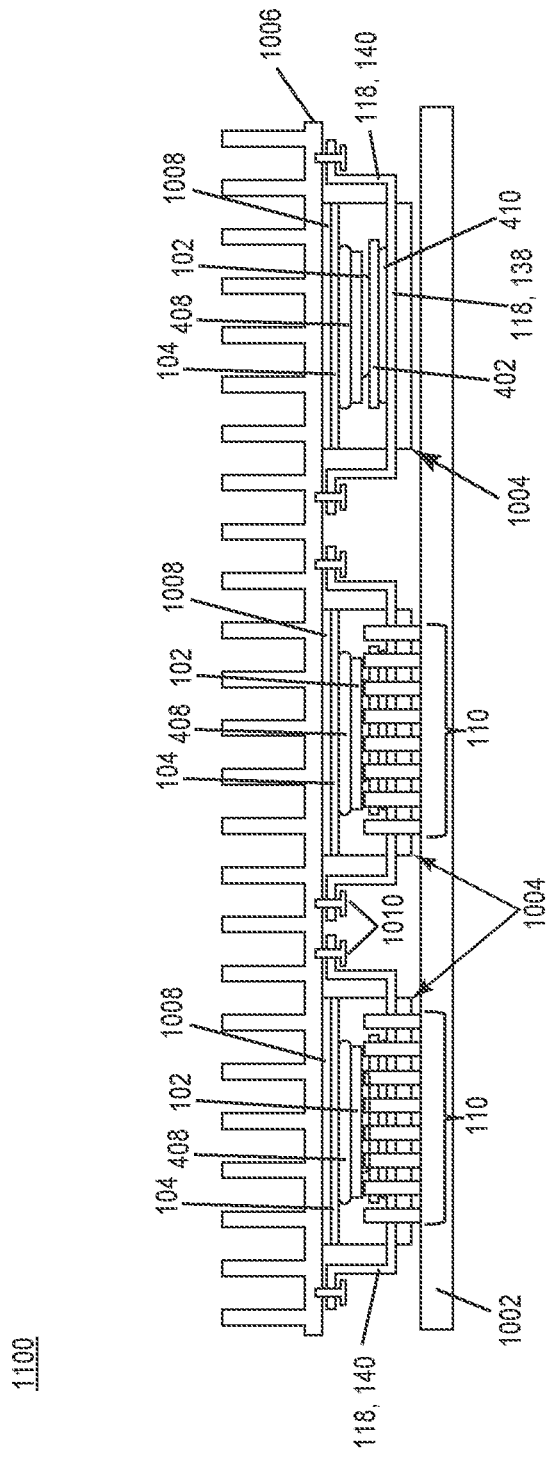
FIG. 11 illustrates a cross-sectional view of another embodiment of an electronic assembly that includes a circuit board and one or more molded semiconductor packages attached to the circuit board.

FIG. 11 illustrates a cross-sectional view of another embodiment of an electronic assembly 1100 that includes a circuit board 1002 and one or more molded semiconductor packages 1004 attached to the circuit board 1002. The embodiment illustrated in FIG. 11 is similar to the embodiment illustrated in FIGS. 10A through 10D. Different, however, the second part 140 of the heat sink clip 118 that protrudes from the molding compound 120 of each package 1004 is bent in a direction towards the heat sink 1006. Not every molded semiconductor package 1004 need be orientated the same, as shown in FIG. 11.

Figure 12:
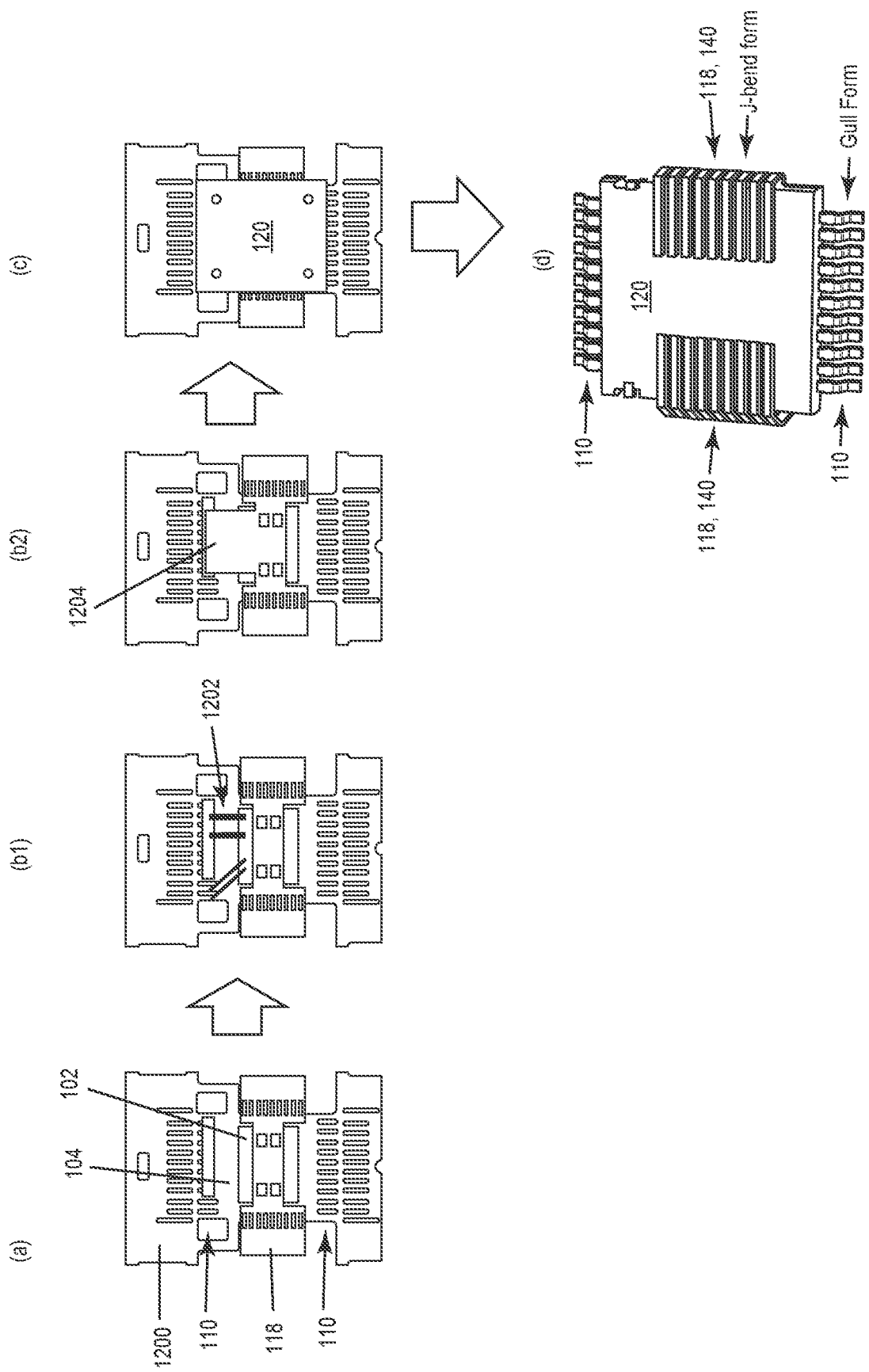
FIG. 12 illustrates an embodiment of a method of producing any of the semiconductor packages described herein in connection with FIGS. 1A through 11.

FIG. 12 illustrates an embodiment of a method of producing any of the semiconductor packages described herein in connection with FIGS. 1A through 1I. A semiconductor die 102 is attached to each substrate 104 of a leadframe 1200 and a heat sink clip 118 is attached to the exposed side of each semiconductor die 102 (block 'a'). A single semiconductor die 102 is shown in FIG. 12 but several dies may be batch processed using the leadframe 1200.

Electrical conductors are then connected between some leads 110 of the leadframe 1200 and corresponding pad(s) of the semiconductor die 102. The other leads 110 extend from the substrate 104 and are thus at substrate potential (e.g., ground). The electrical conductors may be bond wires 1202 (block 'b1') or a metal clip 1202 (block 'b2'), for example. Each semiconductor die 102, part of the leads 110, part of each heat sink clip 118, and at least part of each substrate 104 are then encapsulated in molding compound 120 (block 'c'). Each molded package may be subjected to additional processing, such as mold flash removal, cleaning, plating, etc. The second part 140 of the heat sink clip 118 and the leads 110 for each molded package are then bent into preferred configurations (block 'd'). The second part 140 of the heat sink clip 118 and the leads 110 may have the same configuration or different configurations. For example, the second part 140 of the heat sink clip 118 has a J-bend form whereas the leads 110 have a gull wing form. However, this is just an example and other clip and lead configurations are possible.

Figure 13B:
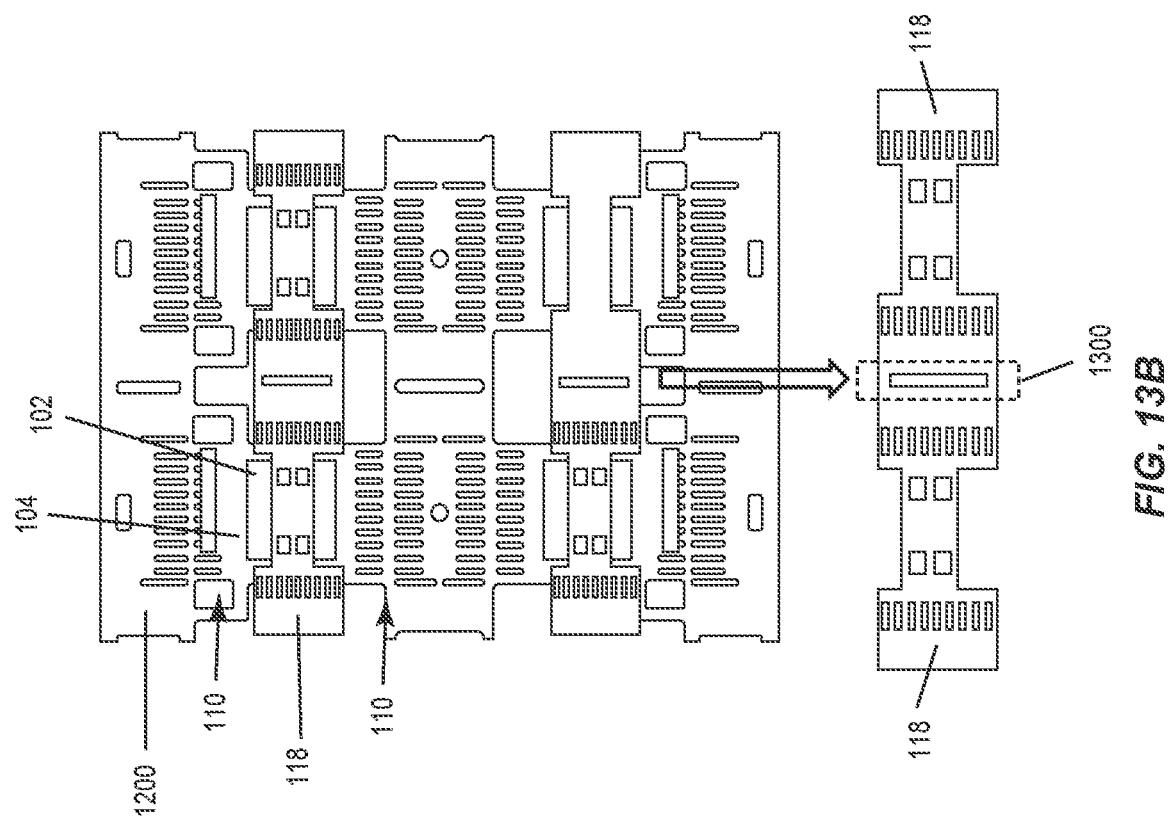
FIGS. 13A and 13B illustrate plan views of different embodiments of the heat sink clip as used during batch package production.
Figure 13A:
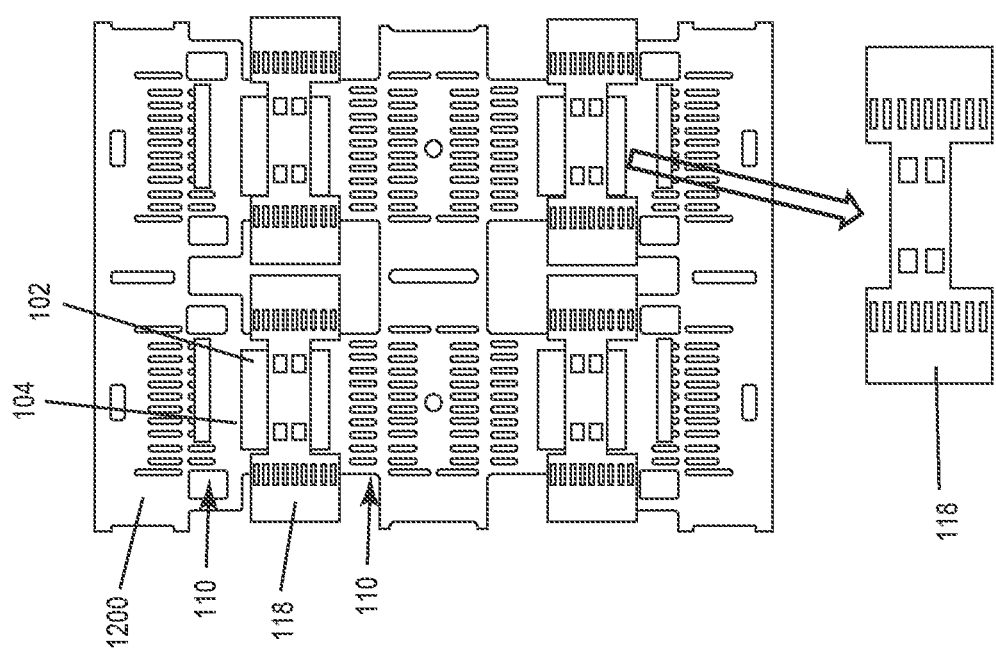

FIGS. 13A and 13B illustrate different embodiments of the heat sink clip 118 as used during batch package production, e.g., as described above in connection with FIG. 12. As shown in FIG. 13A, a single heat sink clip 118 may be used per package unit. As shown in FIG. 13B, two heat sink clips 118 may be joined together and used for each pair of neighboring package units. The adjoined heat sink clips 118 are severed along a singulation region 1300 after molding, e.g., as part of the lead and tie bar severing process.

Although the present disclosure is not so limited, the following numbered examples demonstrate one or more aspects of the disclosure.

Example 1. A molded semiconductor package, comprising: a semiconductor die; a substrate attached to a first side of the semiconductor die; a plurality of leads electrically connected to a pad at a second side of the semiconductor die opposite the first side; a heat sink clip thermally coupled to the pad; and a molding compound encapsulating the semiconductor die, part of the leads, part of the heat sink clip, and at least part of the substrate, wherein the molding compound has a first main side, a second main side opposite the first main side and at which the substrate is disposed, and an edge extending between the first main side and the second main side, wherein the leads protrude from opposing first and second faces of the edge of the molding compound, wherein the heat sink clip protrudes from opposing third and fourth faces of the edge of the molding compound.

Example 2. The molded semiconductor package of example 1, wherein a part of the heat sink clip that protrudes from the opposing third and fourth faces of the edge of the molding compound is bent over and covers part of the first main side of the molding compound.

Example 3. The molded semiconductor package of example 1, wherein a part of the heat sink clip that protrudes from the opposing third and fourth faces of the edge of the molding compound is bent in a direction which the first main side of the molding compound faces without being bent over any part of the first main side of the molding compound.

Example 4. The molded semiconductor package of example 1, wherein a part of the heat sink clip that protrudes from the opposing third and fourth faces of the edge of the molding compound is unbent.

Example 5. The molded semiconductor package of any of examples 1 through 4, wherein a first part of the heat sink clip is disposed between the second side of the semiconductor die and the first main side of the molding compound, and wherein the first part of the heat sink clip is completely covered by the molding compound at the first main side of the molding compound.

Example 6. The molded semiconductor package of example 5, wherein a second part of the heat sink clip protrudes from the opposing third and fourth faces of the edge of the molding compound.

Example 7. The molded semiconductor package of example 6, wherein the second part of the heat sink clip comprises a plurality of fins.

Example 8. The molded semiconductor package of example 6 or 7, wherein the second part of the heat sink clip is bent over and covers part of the first main side of the molding compound.

Example 9. The molded semiconductor package of any of examples 6 through 8, wherein the second part of the heat sink clip is attached to the first part of the heat sink clip inside the molding compound by solder, and wherein an electrically insulative thermal interface material is applied to the second part of the heat sink clip outside the molding compound.

Example 10. The molded semiconductor package of any of examples 6 through 9, wherein the second part of the heat sink clip is thermally coupled to the first part of the heat sink clip inside the molding compound by an electrically insulative thermal interface material embedded in the molding compound, and wherein the electrically insulative thermal interface material electrically isolates the first part of the heat sink clip from the second part of the heat sink clip.

Example 11. The molded semiconductor package of any of examples 1 through 10, wherein the substrate is uncovered by the molding compound at the second main side of the molding compound, and wherein the semiconductor die has double-sided cooling via the substrate at the first side of the semiconductor die and via the heat sink clip at the second side of the semiconductor die.

Example 12. The molded semiconductor package of any of examples 1 through 11, wherein the heat sink clip is electrically isolated from a tie bar within the molding compound.

Example 13. The molded semiconductor package of any of examples 1 through 12, wherein the heat sink clip is electrically isolated from the leads within the molding compound Example 14. The molded semiconductor package of any of examples 1 through 13, wherein the leads are soldered to a metal clip inside the molding compound, wherein the metal clip is attached to the pad at the second side of the semiconductor die, wherein a first part of the heat sink clip is disposed between the metal clip and the molding compound, and wherein an electrically insulative thermal interface material embedded in the molding compound thermally couples the metal clip to the first part of the heat sink clip and electrically isolates the first part of the heat sink clip from the metal clip.

Example 15. The molded semiconductor package of example 14, wherein the first part of the heat sink clip is completely covered by the molding compound at the first main side of the molding compound.

Example 16. The molded semiconductor package of any of examples 1 through 15, wherein the heat sink clip has a plurality of openings inside the molding compound.

Example 17. The molded semiconductor package of any of examples 1 through 16, wherein the molding compound covers the heat sink clip in a first region where the heat sink clip initially protrudes from the opposing third and fourth faces of the edge of the molding compound, and wherein a second region of the heat sink clip spaced further outward than the first region is uncovered by the molding compound.

Example 18. An electronic assembly, comprising: a circuit board; and a molded semiconductor package attached to the circuit board, wherein the molded semiconductor package comprises: a semiconductor die; a substrate attached to a first side of the semiconductor die; a plurality of leads electrically connected to a pad at a second side of the semiconductor die opposite the first side; a heat sink clip thermally coupled to the pad; and a molding compound encapsulating the semiconductor die, part of the leads, part of the heat sink clip, and at least part of the substrate, wherein the molding compound has a first main side, a second main side opposite the first main side and at which the substrate is disposed, and an edge extending between the first main side and the second main side, wherein the leads protrude from opposing first and second faces of the edge of the molding compound and attach to the circuit board, wherein the heat sink clip protrudes from opposing third and fourth faces of the edge of the molding compound.

Example 19. The electronic assembly of example 18, wherein both the first side of the semiconductor die and the second main side of the molding compound face the circuit board, wherein the first main side of the molding compound faces away from the circuit board, and wherein a part of the heat sink clip that protrudes from the opposing third and fourth faces of the edge of the molding compound is bent over and covers part of the first main side of the molding compound.

Example 20. The electronic assembly of example 18, wherein both the first side of the semiconductor die and the second main side of the molding compound face the circuit board, wherein the first main side of the molding compound faces away from the circuit board, and wherein a part of the heat sink clip that protrudes from the opposing third and fourth faces of the edge of the molding compound is bent away from the circuit board without being bent over any part of the first main side of the molding compound.

Example 21. The electronic assembly of example 18, wherein both the first side of the semiconductor die and the second main side of the molding compound face the circuit board, wherein the first main side of the molding compound faces away from the circuit board, and wherein a part of the heat sink clip that protrudes from the opposing third and fourth faces of the edge of the molding compound is unbent and spaced apart from the circuit board.

Example 22. The electronic assembly of any of examples 18 through 21, further comprising: a heat sink thermally coupled to the substrate of the molded semiconductor package, wherein a part of the leads that protrude from the opposing first and second faces of the edge of the molding compound attaches to the circuit board adjacent the first main side of the molding compound, wherein a part of the heat sink clip that protrudes from the opposing third and fourth faces of the edge of the molding compound is thermally coupled to the heat sink adjacent the second main side of the molding compound, and wherein the heat sink clip and the heat sink are electrically insulated from one another.

Example 23. The electronic assembly of example 22, wherein the leads are soldered to a metal clip inside the molding compound, wherein the metal clip is attached to the pad at the second side of the semiconductor die, wherein a first part of the heat sink clip is disposed between the metal clip and the second main side of the molding compound, and wherein an electrically insulative thermal interface material embedded in the molding compound thermally couples the metal clip to the first part of the heat sink clip and electrically isolates the heat sink clip from the heat sink.

Example 24. The electronic assembly of example 22, wherein a first part of the heat sink clip is disposed between the second side of the semiconductor die and the second main side of the molding compound, wherein a second part of the heat sink clip protrudes from the opposing third and fourth faces of the edge of the molding compound and is thermally coupled to the heat sink adjacent the second main side of the molding compound, wherein the second part of the heat sink clip is attached to the first part of the heat sink clip inside the molding compound by solder, and wherein an electrically insulative thermal interface material applied to the second part of the heat sink clip outside the molding compound electrically isolates the heat sink from the second part of the heat sink clip.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A molded semiconductor package, comprising:
a semiconductor die;
a substrate attached to a first side of the semiconductor die;
a plurality of leads electrically connected to a pad at a second side of the semiconductor die opposite the first side;
a heat sink clip thermally coupled to the pad; and
a molding compound encapsulating the semiconductor die, part of the leads, part of the heat sink clip, and at least part of the substrate,
wherein the molding compound has a first main side, a second main side opposite the first main side and at which the substrate is disposed, and an edge extending between the first main side and the second main side,
wherein the leads protrude from opposing first and second faces of the edge of the molding compound,
wherein the heat sink clip protrudes from opposing third and fourth faces of the edge of the molding compound.

2. The molded semiconductor package of claim 1, wherein a part of the heat sink clip that protrudes from the opposing third and fourth faces of the edge of the molding compound is bent over and covers part of the first main side of the molding compound.

3. The molded semiconductor package of claim 1, wherein a part of the heat sink clip that protrudes from the opposing third and fourth faces of the edge of the molding compound is bent in a direction which the first main side of the molding compound faces without being bent over any part of the first main side of the molding compound.

4. The molded semiconductor package of claim 1, wherein a part of the heat sink clip that protrudes from the opposing third and fourth faces of the edge of the molding compound is unbent.

5. The molded semiconductor package of claim 1, wherein a first part of the heat sink clip is disposed between the second side of the semiconductor die and the first main side of the molding compound, and wherein the first part of the heat sink clip is completely covered by the molding compound at the first main side of the molding compound.

6. The molded semiconductor package of claim 5, wherein a second part of the heat sink clip protrudes from the opposing third and fourth faces of the edge of the molding compound.

7. The molded semiconductor package of claim 6, wherein the second part of the heat sink clip comprises a plurality of fins.

8. The molded semiconductor package of claim 6, wherein the second part of the heat sink clip is bent over and covers part of the first main side of the molding compound.

9. The molded semiconductor package of claim 6, wherein the second part of the heat sink clip is attached to the first part of the heat sink clip inside the molding compound by solder, and wherein an electrically insulative thermal interface material is applied to the second part of the heat sink clip outside the molding compound.

10. The molded semiconductor package of claim 6, wherein the second part of the heat sink clip is thermally coupled to the first part of the heat sink clip inside the molding compound by an electrically insulative thermal interface material embedded in the molding compound, and wherein the electrically insulative thermal interface material electrically isolates the first part of the heat sink clip from the second part of the heat sink clip.

11. The molded semiconductor package of claim 1, wherein the substrate is uncovered by the molding compound at the second main side of the molding compound, and wherein the semiconductor die has double-sided cooling via the substrate at the first side of the semiconductor die and via the heat sink clip at the second side of the semiconductor die.

12. The molded semiconductor package of claim 1, wherein the heat sink clip is electrically isolated from the leads within the molding compound.

13. The molded semiconductor package of claim 1, wherein the leads are soldered to a metal clip inside the molding compound, wherein the metal clip is attached to the pad at the second side of the semiconductor die, wherein a first part of the heat sink clip is disposed between the metal clip and the molding compound, and wherein an electrically insulative thermal interface material embedded in the molding compound thermally couples the metal clip to the first part of the heat sink clip and electrically isolates the first part of the heat sink clip from the metal clip.

14. The molded semiconductor package of claim 13, wherein the first part of the heat sink clip is completely covered by the molding compound at the first main side of the molding compound.

15. The molded semiconductor package of claim 1, wherein the heat sink clip has a plurality of openings inside the molding compound.

16. The molded semiconductor package of claim 1, wherein the molding compound covers the heat sink clip in a first region where the heat sink clip initially protrudes from the opposing third and fourth faces of the edge of the molding compound, and wherein a second region of the heat sink clip spaced further outward than the first region is uncovered by the molding compound.

17. An electronic assembly, comprising:
a circuit board; and
a molded semiconductor package attached to the circuit board,
wherein the molded semiconductor package comprises:
a semiconductor die;
a substrate attached to a first side of the semiconductor die;
a plurality of leads electrically connected to a pad at a second side of the semiconductor die opposite the first side;
a heat sink clip thermally coupled to the pad; and
a molding compound encapsulating the semiconductor die, part of the leads, part of the heat sink clip, and at least part of the substrate,
wherein the molding compound has a first main side, a second main side opposite the first main side and at which the substrate is disposed, and an edge extending between the first main side and the second main side,
wherein the leads protrude from opposing first and second faces of the edge of the molding compound and attach to the circuit board,
wherein the heat sink clip protrudes from opposing third and fourth faces of the edge of the molding compound.

18. The electronic assembly of claim 17, wherein both the first side of the semiconductor die and the second main side of the molding compound face the circuit board, wherein the first main side of the molding compound faces away from the circuit board, and wherein a part of the heat sink clip that protrudes from the opposing third and fourth faces of the edge of the molding compound is bent over and covers part of the first main side of the molding compound.

19. The electronic assembly of claim 17, wherein both the first side of the semiconductor die and the second main side of the molding compound face the circuit board, wherein the first main side of the molding compound faces away from the circuit board, and wherein a part of the heat sink clip that protrudes from the opposing third and fourth faces of the edge of the molding compound is bent away from the circuit board without being bent over any part of the first main side of the molding compound.

20. The electronic assembly of claim 17, wherein both the first side of the semiconductor die and the second main side of the molding compound face the circuit board, wherein the first main side of the molding compound faces away from the circuit board, and wherein a part of the heat sink clip that protrudes from the opposing third and fourth faces of the edge of the molding compound is unbent and spaced apart from the circuit board.

21. The electronic assembly of claim 17, further comprising:
   a heat sink thermally coupled to the substrate of the molded semiconductor package,
   wherein a part of the leads that protrude from the opposing first and second faces of the edge of the molding compound attaches to the circuit board adjacent the first main side of the molding compound,
   wherein a part of the heat sink clip that protrudes from the opposing third and fourth faces of the edge of the molding compound is thermally coupled to the heat sink adjacent the second main side of the molding compound, and
   wherein the heat sink clip and the heat sink are electrically insulated from one another.

22. The electronic assembly of claim 21, wherein the leads are soldered to a metal clip inside the molding compound, wherein the metal clip is attached to the pad at the second side of the semiconductor die, wherein a first part of the heat sink clip is disposed between the metal clip and the second main side of the molding compound, and wherein an electrically insulative thermal interface material embedded in the molding compound thermally couples the metal clip to the first part of the heat sink clip and electrically isolates the heat sink clip from the heat sink.

23. The electronic assembly of claim 21, wherein a first part of the heat sink clip is disposed between the second side of the semiconductor die and the second main side of the molding compound, wherein a second part of the heat sink clip protrudes from the opposing third and fourth faces of the edge of the molding compound and is thermally coupled to the heat sink adjacent the second main side of the molding compound, wherein the second part of the heat sink clip is attached to the first part of the heat sink clip inside the molding compound by solder, and wherein an electrically insulative thermal interface material applied to the second part of the heat sink clip outside the molding compound electrically isolates the heat sink from the second part of the heat sink clip.

* * * * *